United States Patent [19]

McElroy

[11] Patent Number: 4,490,736
[45] Date of Patent: Dec. 25, 1984

[54] SEMICONDUCTOR DEVICE AND METHOD OF MAKING

[75] Inventor: David J. McElroy, Houston, Tex.

[73] Assignee: Texas Instruments Incorporated, Dallas, Tex.

[21] Appl. No.: 151,082

[22] Filed: May 19, 1980

Related U.S. Application Data

[60] Continuation-in-part of Ser. No. 032,597, Apr. 23, 1979, Pat. No. 4,213,142, which is a continuation of Ser. No. 797,273, May 16, 1977, abandoned, which is a division of Ser. No. 573,696, May 1, 1975, Pat. No. 4,061,506.

[51] Int. Cl.³ .................... H01L 29/02; H01L 21/265
[52] U.S. Cl. ........................................ 357/41; 29/571; 29/576 B; 148/187; 357/23; 357/55; 357/88; 357/89; 357/90; 357/91
[58] Field of Search .................. 357/23, 41, 55, 88, 357/89, 90, 91; 148/1.5, 187; 29/571, 576 B

[56] References Cited

U.S. PATENT DOCUMENTS

| 3,752,711 | 8/1973 | Kooi et al. .................. 29/571 X |
| 3,936,861 | 2/1976 | Borel et al. ....................... 357/91 |
| 3,967,365 | 7/1976 | Friedrich ........................ 357/91 |
| 4,055,444 | 10/1977 | Rao ................................ 148/1.5 |
| 4,295,897 | 10/1981 | Tubbs et al. .............. 148/187 X |
| 4,325,169 | 4/1982 | Ponder et al. ................. 29/571 |

OTHER PUBLICATIONS

Eaggin et al., *Electronics*, Sep. 20, 1969, pp. 88–94.
Stein et al., *IEEE J. of Solid State Circuits*, vol. SC-7, No. 5, Oct. 1972, pp. 336–340.

*Primary Examiner*—G. Ozaki
*Attorney, Agent, or Firm*—John G. Graham

[57] ABSTRACT

Semiconductor devices are made by a process in which impurity is introduced, by ion implant, for example, after electrode layers are in place so that inaccuracies in alignment of masks or patterns are compensated. The implanted impurity changes the electrical characteristics of portions of the semiconductor device affected by the registration inaccuracies whereby malfunctions in the completed devices are prevented.

10 Claims, 18 Drawing Figures

SEMICONDUCTOR DEVICE AND METHOD OF MAKING

RELATED CASES

This application is in part a continuation of my copending application Ser. No. 032,597, filed Apr. 23, 1979, now U.S. Pat. No. 4,213,142, which was a continuation of application Ser. No. 797,273 filed May 16, 1977, now abandoned, which was a divisional of my application Ser. No. 573,696, filed May 1, 1975, now U.S. Pat. No. 4,061,506, issued Dec. 6, 1977.

This invention relates to semiconductors and more particularly to semiconductors in which inaccuracies in geometries result in immediate or delayed malfunction.

As is well known to those skilled in the art, successive improvements in semiconductor technologies have resulted in increasing reduction in size of complex semiconductors and to the inclusion within very small geometries of hundreds or thousands of tiny semiconductive components (e.g., bipolar and MOS transistors). As the size of complex semiconductors such as bipolar and MOS integrated circuits has progressively decreased, the criticality of precise delineation of geometries has increased. Moreover, as the number of individual components within one integrated circuit configuration has increased, the necessity for reliable and reproducible manufacturing has correspondingly increased; and in order to achieve acceptable manufacturing yields, it has been necessary to resort to complex and costly manufacturing techniques to insure precise registrations of the necessary masks, diffusions, metallizations and/or other process parameters.

Because, despite improvements in precise geometrical controls, the exceedingly small dimensional sizes of the integrated circuit components has resulted in significant percentages of inoperative units, proposals have been made for increasing yields of finished integrated circuits by testing the operative components within the overall circuits and interconnecting only those which tested favorably. While this has resulted in substantial and effective improvements in manufacturing yields, the incident costs involved have encouraged the continuing search for additional improvements in integrated circuit techniques.

It is one object of the invention to improve dimensions and yields in integrated circuit manufacture.

It is another object of the invention to eliminate or markedly reduce the number of circuits which initially appear sound but which with the passage of time become inoperative.

In accordance with one feature of the invention, degradation of circuit components with the passage of time is markedly reduced or eliminated by introduction of selected impurities into the surface of the integrated circuit at a point near to completion of its processing.

In accordance with another feature of the invention, the introduction of selected impurities in controlled quantities brings about desired changes in the surface states of those portions of the integrated circuit which are undesirably exposed either because of random defects, inaccuracies in geometries and/or registrations of masks employed in their fabrication, or intentionally in order to achieve improvements in other geometries.

In accordance with yet another feature of the invention, the changes in the surface states prevents the always present traces of contamination impurities from altering the electrical characteristics with the passage of time sufficiently to bring about malfunctions of the circuit elements.

In accordance with yet another feature of the invention, the fabrication of the semiconductor components is achieved through a succession of compatible process steps which in cooperative combination with the introduction of the selected impurities results in the production of circuit devices having excellent characteristics and very high yields.

In accordance with an alternative feature of the invention, where it is desirable to identify certain random defects or inaccuracies in semiconductor geometries and/or registrations of masks employed in their fabrication, different impurities are introduced to the surface of the semiconductive device at a point near its completion, whereby the different impurities immediately result in the improper electrical functioning of the parts whose geometries are so defective or misaligned, thereby identifying them at the outset and preventing the misidentification of latently defective units as those whose parameters are good.

These and other objects and features of the invention will be evident from the following detailed description with reference to the drawings in which.

Figure 1:
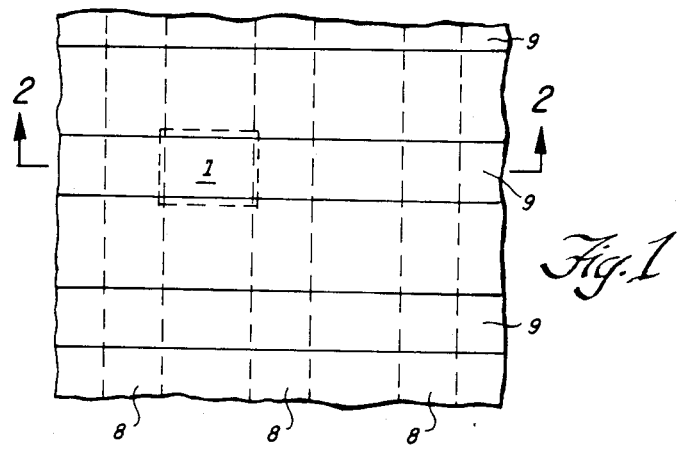
FIG. 1 is a partial plan view of a representative MOS integrated circuit depicting characteristic geometries thereof.

Now turning more specifically to the drawings, it will be observed that FIG. 1 illustrates a portion of a typical metal oxide semiconductor integrated circuit of the type more fully disclosed in U.S. patent application Ser. No. 567,459 filed by R. H. Crawford et al on July 25, 1966 and granted as U.S. Pat. No. 3,541,543 on Nov. 17, 1970. Although such an MOS integrated circuit may contain thousands of individual active elements, only one such element (which in FIG. 1 is identified with the reference numeral 1) has been shown in detail so as not to obscure the description of the invention. Transistor 1 is shown in more detail in the sectional view of FIG. 2 where it is seen to include source 2, drain 1, channel 4, gate 5 and gate insulating layer 6. As the operation of MOS transistors is well known to those skilled in the art and is described in detail in the book entitled "MOSFET in Circuit Design" by Robert H. Crawford, published by McGraw-Hill and copyrighted in 1967 by Texas Instruments Incorporated, and in the book entitled "MOS/LSI Design and Application" by William N. Carr and Jack P. Mize, published by McGraw-Hill and copyrighted in 1972 by Texas Instruments Incorporated, further description of the operative features and characteristics of such devices will be described only in relation to those features which characterize the present invention.

For purposes of illustration, it may be considered that the source and drain are of P-type material and that the main body of the semiconductor wafer 7 is an N-type, thus constituting a P-channel MOS semiconductor device. However, the priciples of the invention are applicable to other semiconductors including those of the N-channel variety.

Now turning to FIG. 1, it will be observed that the MOS transistor 1 forms one of many cells of a read-only memory or ROM of conventional type. The ROM is created by a cross matrix of diffused regions 8 and metallization stripes 9. The latter, for the purposes of this illustrative embodiment, may be thin layers of aluminum deposited and patterned by conventional techniques. Electrical connections are made to these thin layers of aluminum as well as to the source and drain areas of the semiconductor by conventional techniques of the type illustrated in the aforementioned patent and at points beyond the margins of the section of the semiconductor wafer illustrated in FIG. 1.

Figure 2:
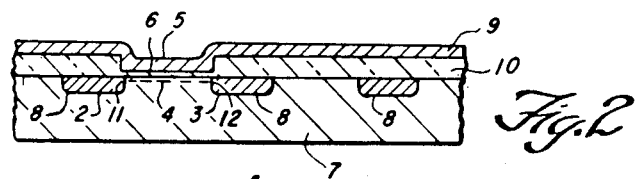
FIG. 2 is a sectional view taken through a section of FIG. 1.

In conventional fabrication of MOS integrated circuits, a thin wafer of semiconductor material of one type conductivity such as that identified by numeral 7 in FIG. 2 is first masked as by a thick oxide layer, and oxide is removed in a pattern to expose only those areas into which conductivity affecting impurities are to be diffused, e.g. regions 8 which provide source and drain 2 and 3. The wafer is then subjected to diffusion of the desired impurities at temperatures suitable for such diffusion and, after the desired penetration and concentrations have been achieved and oxide is regrown over the regions 8, the wafer is removed from the diffusion environment. A surface insulating layer 10', referred to as a field oxide of silicon results from oxide growth and diffusion steps in the process, thus creating a layer of sufficient thickness so that later when the thin layers of metallization are applied, any electric fields developed in normal operation of the devices are insufficient to adversely affect operation of those portions of the semiconductor element other than those where the insulating layer is intentionally thinned as, for example, at the region 6 in FIG. 2.

In the field oxide or thick insulating layer 10', a pattern of thinner portions 6 define the ROM or other circuitry. Conventionally, this is accomplished by masking the wafer to expose only those areas of the field oxide in which thinning is desired. This is done by covering the surface with photoresist, exposing to ultraviolet light through a mask which defines the desired pattern and developing the photoresist. The wafer is then normally etched by suitable etchant until the field oxide material has been removed down to the principal surface of the silicon, using the developed photoresist as a mask. Thereafter, the photoresist is removed and the thin region 6 is prepared either by growth of the oxide at the surface or deposition according to conventional techniques. Upon completion of the thin region 6, the device is ready for metalization which again is accomplished in the conventional manner using photolithographic techniques.

As is well known to those skilled in the art, the proper location of the thinned region 6 is particularly important to the optimum operation of the semiconductive element. If the thinned region extends excessively beyond the projection 11' of the right hand boundary of 12' of the diffused area 3, excessive capacitances may be introduced between the source 2, drain 3, and gate 5. On the other hand, if the thin region does not extend outwardly as far as projections 11' and 12', then upon application of suitable potential to gate 5, the device may not become turned on and its resistance will be high. Thus, dimensioning in alignment becomes important.

Other reasons are important also for achieving dimensional and geometrical precision. These include minimizing physical sizes of the devices as well as reducing manufacturing tolerances required in mass production.

The creation of the thin insulating region and the application of the metallization are accomplished in successive manufacturing operations which utilize different masks. Unless these masks are precisely aligned, there is the likelihood of a small portion of the thin insulating region remaining uncovered by the thin metal layer. Although manufacturing tolerances may be made sufficient to include some slight overlap when dimensions are precisely aligned, the attending packing density inefficiencies because of overlap renders it imperative that the overlap be kept small. Thus, it has been found that to make the overlap tolerances sufficiently large to compensate for normally encountered inaccuracies in precise mask alignments wastes space in the silicon bar, thus reducing density of circuit functions, increasing costs, and in some cases degrading the final product. It has herefore been found that for economic purposes the tolerances must be restricted sufficiently so that in normal manufacturing processes, a significant percentage of devices are produced having residual exposure of some small portion of the thin insulating area such as is identified at 13' in FIG. 3.

As is known to those skilled in the art, the gate insulator 6 of the insulating material must be sufficiently thin in comparison to the normal thickness of the field oxide 10 so that the electric field created in the underlying semiconductor area brings about conduction across the channel 4 at the desired threshhold voltage of perhaps 2 volts, and yet at the same time does not cause sufficient change in the electrical charge carrier concentration in other portions of the underlying material to result in unwanted activity. It has been found that in order to accomplish this, the thickness of the region 6 must be made so small that ambient impurities, migrating surface charge due to inherent internal voltage gradients, or those which may subsequently find their way to the surface will change its characteristics sufficiently to result in unwanted conduction in the material beneath, unless the entire thin region is covered (as for example, by gate metallization 9). For this reason, where there is misregistration sufficient to expose a portion 13' of the thin region 6, inoperative devices have resulted, either immediately, or more frequently after an inordinately short life. It is particularly undesirable that a device test good when it comes off the assembly line and then fail after it has been installed or used in end equipment.

It has also been found that during manufacture, certain random defects may appear as, for example, by mask defects and/or the unwanted existence of bubbles in the photoresist. These, or other causes, may result in tiny regions of thin oxide being exposed rather than covered over by the metallization. In such instances, the device may operate defectively either immediately or after an inordinately short life. However, in accordance with the present invention, through the efficacious introduction of selected conductivity-affecting impurities to at least the exposed areas such as 13', sufficient enhancement of the charge carriers is brought about so as to prevent subsequent unwanted surface effects. This is illustrated in FIG. 4.

In certain configuration contemplated by this invention, (as, for example, where maximum packing density is desired) the width of the metallization may be intentionally made less than that of the thin region, thus intentionally exposing portions of the thin regions. In such configurations, the practice of this invention makes it possible to achieve workable and reliable circuits without thickening the oxide layer or resorting to other elaborate surface passivation techniques.

Figure 3:
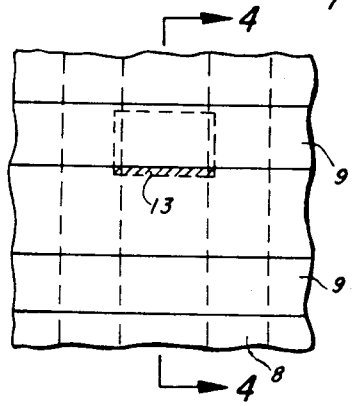
FIG. 3 is an enlarged portion of the illustrative part of FIG. 1 showing in greater detail one of the cells of FIG. 1 and illustrating a misalignment of the gate electrode.
Figure 4:
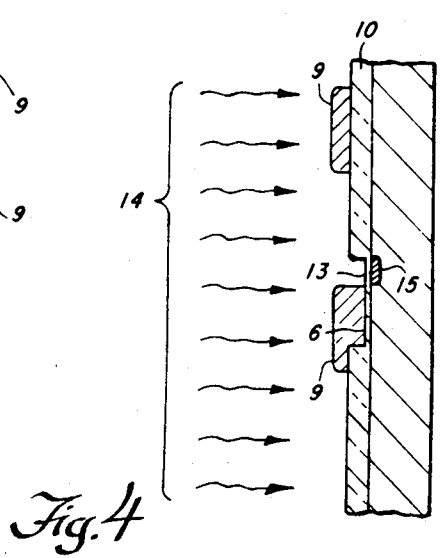
FIG. 4 is a sectional view taken along the section lines 4—4 of FIG. 3.

In FIG. 4, there is a section taken through FIG. 3 showing the misalignment of the metallization and the attendant exposure of surface area 13' of thin insulating material 6. Also shown and depicted by the wavy arrows 14' are the selected conductivity-affecting impurities which are preferably introduced to the surface by ion implantation techniques. These impurities may, in the case of semiconductors having repetitive configurations of elements, be applied to the entire surface. In such instances, metallization and/or thicker insulating material which covers the majority portion of the surface will prevent the conductivity-affecting impurities from adversely changing the electrical characteristics thereof. However, in regions where the critically thin surface areas are exposed, the conductivity-affecting impurities will penetrate through the thin layers sufficiently to cause reinforcement of the underlying conductivity-effecting impurities in the material (shown at 15' in FIG. 4) and thereby prevent subsequent or residually remaining surface impurities or parasitic surface charge within or at the thin layer 13' from adversely affecting the operating characteristics of the device.

An alternative application of the principles of the invention contemplates utilizing impurities of an opposite conductivity-affecting type from those described above. In such instances, degradation of the units is immediate, for such impurities reinforce or add to the adverse affect of the residual or subsequent unwanted impurities in the very thin layers and bring about an immediate malfunction of the units in question. In such instances, only those integrated circuit arrays having no units of sufficient misalignment to expose thin regions will be fully operative.

Although in the embodiment illustrated herein, the metal oxide semiconductor integrated circuit is composed of repetitive configurations of like elements and is so structured that all regions of the surface are sufficiently covered to prevent adverse effects of the finally introduced conductivity-affecting impurities except in cases where sufficient misalignment or lesser metallization width has occured to expose portions of the thin regions, the principles of the invention are applicable to other integrated circuits where the conductivity-affecting impurities would be restricted to certain portions of the surface only. In such instances, the use of ion implantation is especially efficacious, for such techniques permit the carefully selected application of impurities to precisely delineated portions of the surface only. However, there and other obvious adaptations and applications of the invention will be evident to those skilled in the art.

As one specific example, an n-type 3 to 6 ohm-centimeter, 111 plane, phosphorous dopes, two inch diameter silicon water of 16 to 18 mils thickness was given an initial brief exposure to conventional acid clean-up. Thereafter, it was placed in a furnace for approximately 20 minutes at a temperature of about 1000° C. until an oxide layer had grown to a thickness of approximately 3,000 angstroms. The wafer was then removed from the furnace. After cooling to room temperature, it was covered with a thin coating (approximately 8,000 angstroms thick) of photoresist material (Eastman Kodak Company type KMER).

The photoresist material was spun on; that is, after application to the surface of the wafer, the wafer was rotated at high speed in order to distribute the resist evenly. Thereupon, it was baked for approximately 15 minutes at a temperature of 60° to 70° C. in an inert ($N_2$) atmosphere. A photomask was then positioned adjacent to and over the photoresist covered surface to cover those areas other than where source and drain diffusions were desired. Thereupon, ultraviolet light was directed to the photomask to expose those portions of the photoresist not covered by the mask. After exposure, the photoresist was developed, using KMER developer in which the wafer was immersed for approximately 2 minutes at a temperature of approximately 27° C.

After development and thorough rinsing, photoresist material covered the surface except in those regions where diffusions were desired. The wafer was then hard-baked at approximately 170° C. for about 3 minutes (15 minutes slowrise, 15 minutes at temperature). The wafer was next immersed in what is known in the semiconductor industry as common oxide etch (an acid having the following constituency: 10% by volume of 49% HF in high purity deionized water).

After approximately 4 minutes, the oxide was etched away in the exposed areas, and the wafer was removed from the common oxide etch and thoroughly rinsed in deionized water. It was then immersed in photoresist solvent to remove the remaining photoresist material and was then subjected to an acid cleanup which involved immersion in a solution including $H_2SO_4$ and $H_2O_2$. The wafer was then again thoroughly rinsed in deionized water and air dried, whereupon it was ready for the first diffusion.

The wafer was next introduced into a diffusion furnace and heated to a temperature of 1,050° C. at which time vapor containing boron was introduced to the surface of the wafer during a time of approximately 45 minutes. At the end of the 45 minutes, the boron vapor was discontinued and inert gas (nitrogen) was passed over the wafer as it cooled to room temperature. Inasmuch as over the surface of the wafer a film of boron-silicate glass was formed, the wafer was exposed to hydrogen fluoride vapor for approximately 30 seconds until the boron-silicate glass was volatilized and removed. Thereupon, the wafer was reintroduced to the furnace, heated to approximately 900° C. and then exposed to an oxidizing atmosphere for about 12 hours until over the entire surface of the wafer a thick oxide film of approximately 14,000 angstroms was formed.

After cooling, the wafer was again coated with photoresist material, baked, overlaid with a mask which defined the gate regions and then exposed to ultraviolet light. Next, the photoresist was developed, leaving photoresist material over the entire surface of the wafer except in those regions where the gates were to be formed. At this point, the wafer was again subjected to appropriate etch to remove the oxide except in the exposed regions over the gates. After this was accomplished, the photoresist was removed from the surface by immersing it in photoresist solvent. The wafer was again subjected to acid cleanup (as described above). It then was thoroughly rinsed in deionized water and reintroduced to the furnace where it was heated to 950° C. and exposed to an oxidizing atmosphere (steam) until a gate oxide layer of approximately 1,000 angstroms thickness was formed.

After cooling, the wafer was placed in an ion implant chamber where it was subjected to a beam of boron ions which had been accelerated to a potential of 50 kev. A beam intensity of approximately six microamperes was continued for approximately 10 seconds for a total dose of $3 \times 10^{11}$ per square centimeter after which ion implantation was terminated and the wafer was removed from the implant chamber. It was then again subjected to acid cleanup.

The velocity of the ions and the thickness of the oxide gate layer were interrelated such that the majority of the boron ions passed through the thin oxide layer overlying the gate region and penetrated into the surface of the semiconductor material immediately adjacent thereto. However, the velocity of the boron ions was not sufficient to completely penetrate the much thicker oxide layers which existed over the remainder of the slice.

After the cleanup operations were completed, the slice was reintroduced to the furnace and heated in an inert atmosphere to approximately 900° C. where it remained for approximately 15 minutes. Heating to this level tended to activate the implanted ions by permitting their appropriate distribution throughout the crystal and lattice structure of the semiconductor material.

Next, the wafer was coated with photoresist material, masked, exposed and developed so as to expose for etching only those areas where electrical contacts were to be made thereto. Thereupon, the wafer was reintroduced into etching solution for a sufficient period of time to remove the oxide from the areas where contact was to be made and thereafter the wafer was removed from the etching solution, rinsed and the photoresist material was removed.

Aluminum was then deposited over the entire upper surface, including both the etched areas (for electrical contact) and over the remaining areas still covered with oxide. This was accomplished by using conventional filament-type evaporation at room temperature, with the wafer mounted on a planetary holder. Evaporation/deposition was continued until the thickness of the coating reached approximately one micron. A pattern of photoresist material (using techniques similar to those described above) was then formed on the surface to expose those areas where unwanted metal was to be removed, and the wafer was then immersed in leaching solution to remove the exposed metal. Thereafter, the wafer was thoroughly rinsed in deionized water and dried.

The metal interconnecting pattern and the metallization for the source, drain and gate portions of the active elements on the wafer was now completed. However, in accordance with the features of this invention, the wafer was then introduced into the ion implant chamber and a beam of phosphorous ions of total dose equal to approximately $8 \times 10^{12}$ ions per square centimeter was directed over the entire surface. These ions were accelerated to a potential of approximately 100 kev in order that they would have sufficient velocity to pass through any thin oxide regions which might be exposed on the surface and lodge within or adjacent the interface between the oxide and the underlying semiconductor material. After this had been accomplished, the wafer was removed from the ion implant chamber and was heated to approximately 450° C. in an inert atmosphere for 60 minutes. This tended to permit activation of the implanted ions through migration or relocation within the crystal lattice of the semiconductor material. After this had been accomplished, a protective coating was deposited over the entire surface. This involved a deposition of $Si_3N_4$ at 300° C. until a coating of 3,000 to 4,000 angstroms had been formed. Suitable openings in the silicon nitride coating were then made (using photoresist and masking steps similar to those previously described) to expose metal areas for subsequent bonding.

The wafer was now completed and was subjected to life tests involving operation at elevated temperatures for approximately 1,000 hours. Although some misalignment of masks had been intentionally made in order to expose certain portions of the thin oxide, no failure was encountered within the 1,000 hour period, although in companion slices not subjected to the phosphorous ion implant, failures did occur in the majority of devices within that period of time.

Although the foregoing example illustrated the invention as involving specific materials, times and temperatures, it will be evident to those skilled in the art that other materials, times, and temperatures could readily be employed without departing from the scope and principles of the invention. Thus, for example, arsenic, antimony or bismuth ions could be employed instead of phosphorous if the accelerating voltages and beam intensities were adjusted correspondingly. Other modifications and adaptations may occur to those skilled in the art.

Figure 14:
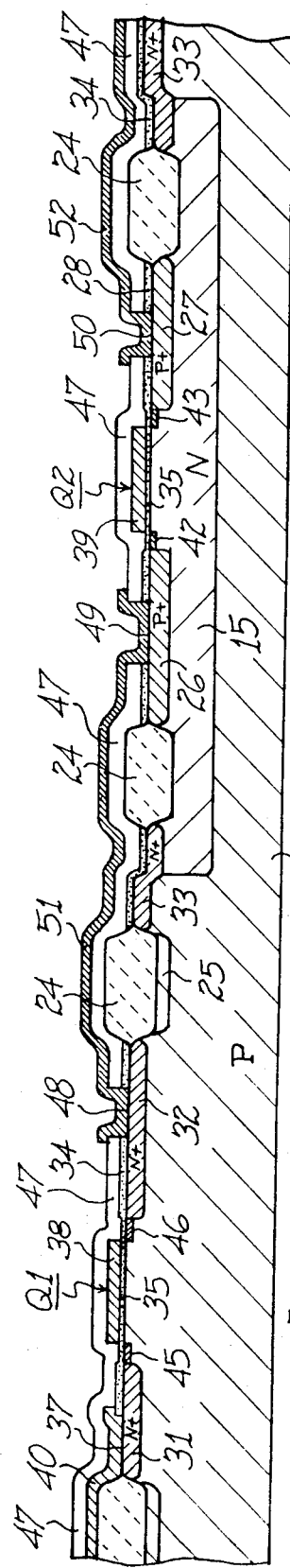
Figure 15:
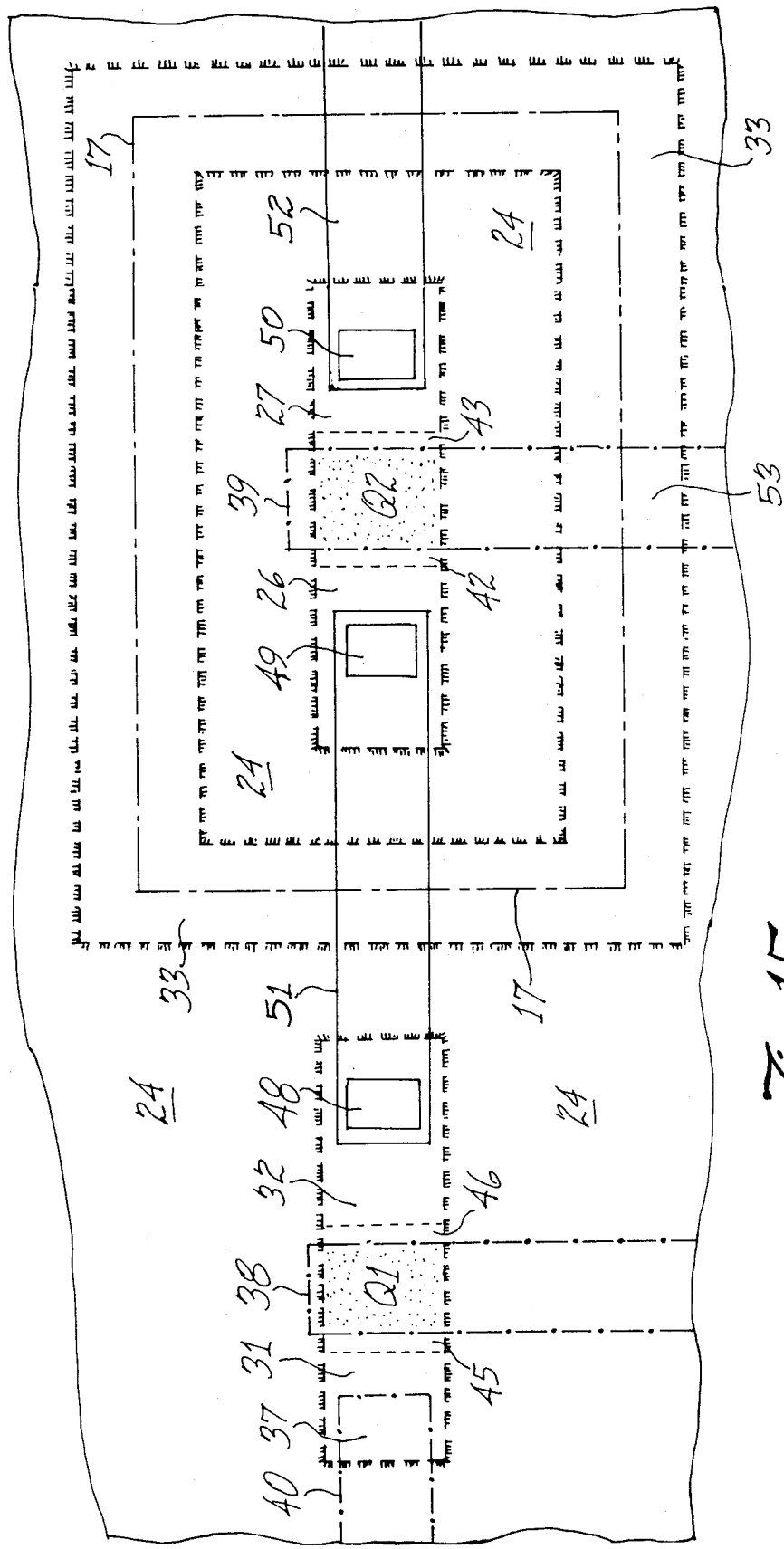

Another embodiment of the invention as first disclosed in co-pending application Ser. No. 83,700, filed Oct. 11, 1979, now U.S. Pat. No. 4,325,169, is set forth in the detailed description which follows, read in conjunction with the accompanying drawings, wherein:

FIGS. 5–14 are elevation views in section of a small part of a semiconductor chip at successive stages of manufacture of two transistors, one P-channel and one N-channel;

FIG. 15 is a plan view of the completed chip of FIG. 14; and

Figure 16:
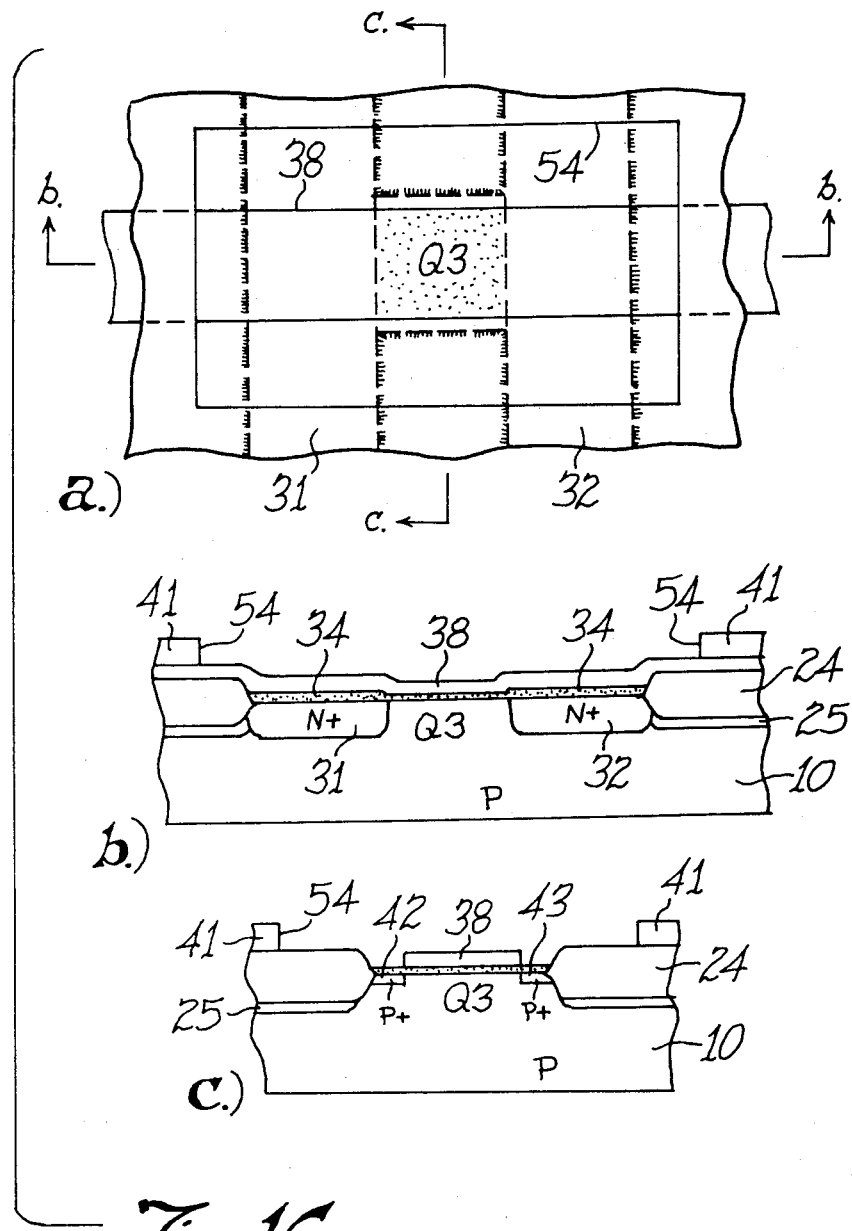

FIG. 16a–16c are plan and section view of the semiconductor chip of FIGS. 5–15 showing another feature of the invention.

Figure 5:
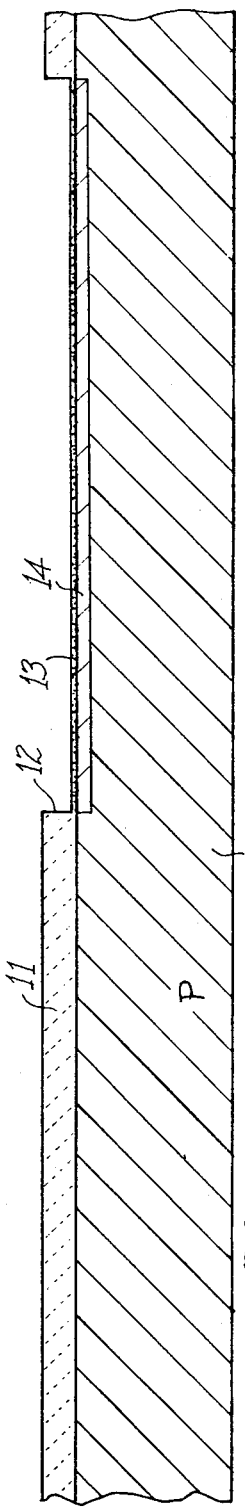

A process for making CMOS devices according to the invention will be described with reference to FIGS. 5–14. The starting material is a slice of P-type silicon doped in growing to a resistivity of about 15 ohm-cm. The segment 10 of the slice seen in the figures contains two transistors and is only a small part of what will be one bar, with the slice including perhaps two or three hundred bars. A processor device of the type used for a handheld calculator contains ten to twenty thousand transistors on a bar less than 150 mils on a side, so the transistors occupy less than about one mil in width. First, the slice is cleaned and a thick thermal oxide layer 11 is grown by maintaining the slice in steam at 900° C. for several hours, producing about 10,000Å thickness. A photoresist masking operation is used to etch the oxide layer 11 to bare silicon in locations 12 where P-channel transistors are to be formed. A thin layer 13 of thermal oxide may be regrown in the location 12 as seen in FIG. 5 to avoid implant damage and outdiffusing, but this is not required. The slice is subjected to a phosphorus ion implant at 150 KeV with a dosage of about $3 \times 10^{12}$ per cm$^2$ to produce a shallow implanted region 14 in the location 12; the thick silicon oxide masks the implant.

Figure 6:
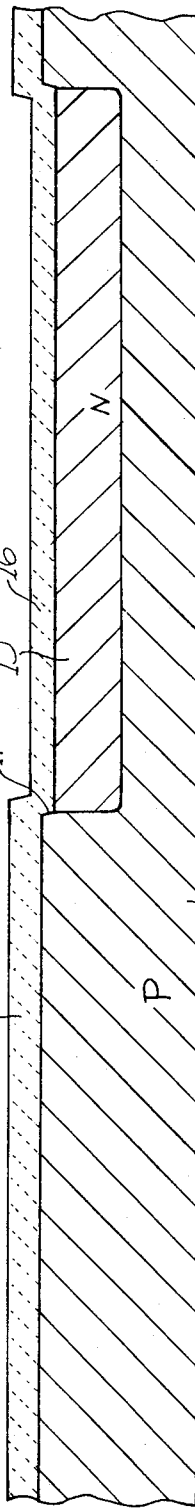

Referring now to FIG. 6 the next step is the N diffusion or tank drive. The slice is held in a tube furnace at a high temperature of about 1200° C. to drive the implanted phosphorus into the silicon to produce a region 15 with a junction depth of about 5 microns. Part of the time in the furnace is in a steam atmosphere so a thermal oxide layer 16 of about 8000Å is grown while the original layer 11 grows somewhat thicker. Silicon is consumed by the oxidation, but due to the masking effect of the remaining oxide layer 11, the growth rate differential produces a step 17 in the surface which will be needed for subsequent alignment.

Figure 7:
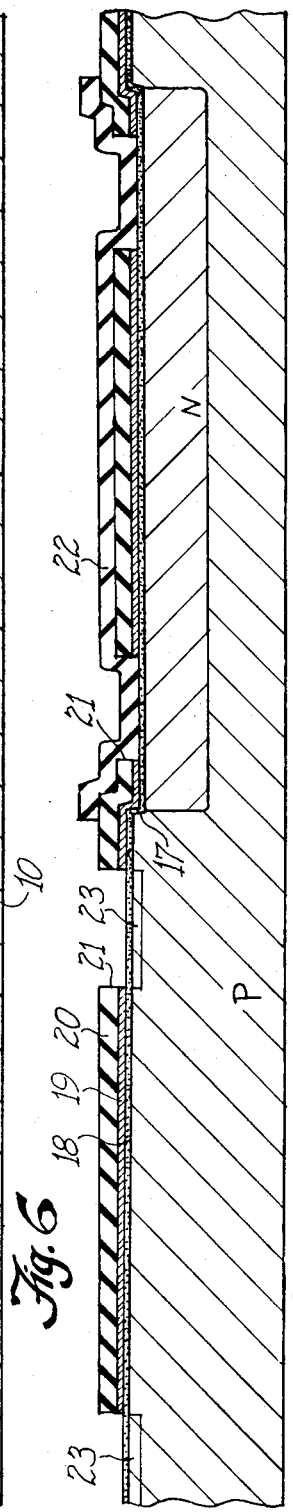

Turning now to FIG. 7, the next step is removal of all of the oxide layers 11 and 16 from the slice, leaving the step 17 of about 2000Å, then a thin thermal oxide layer 18 is regrown to about 1000Å. A layer 19 of silicon nitride is then deposited over the thermal oxide. A coating 20 of photoresist is deposited and exposed to light through a mask which defines the areas to become field oxide, so upon developing holes 21 are left in the photoresist, and an etchant then removes the nitride layer 19 at the holes 21. Next, another layer 22 of photoresist is deposited and exposed to light through a mask which defines the N-type tank regions 15 so upon developing the resist all the tank areas remain covered; the mask used for this photoresist is essentially a color reversal of the tank mask. Using the two photoresist layers as a mask, a boron implant of about $5 \times 10^{12}$ per cm$^2$ at 100 KeV produces P+ regions 23 where channel stops are to be formed. To cure implant damages, a nitrogen anneal is performed as set forth in U.S. Pat. No. 4,055,444 issued to G. R. Mohan Rao, assigned to Texas Instruments. This anneal also pushes the implanted boron deeper into the substrate so less is lost in subsequent oxidation.

Figure 8:
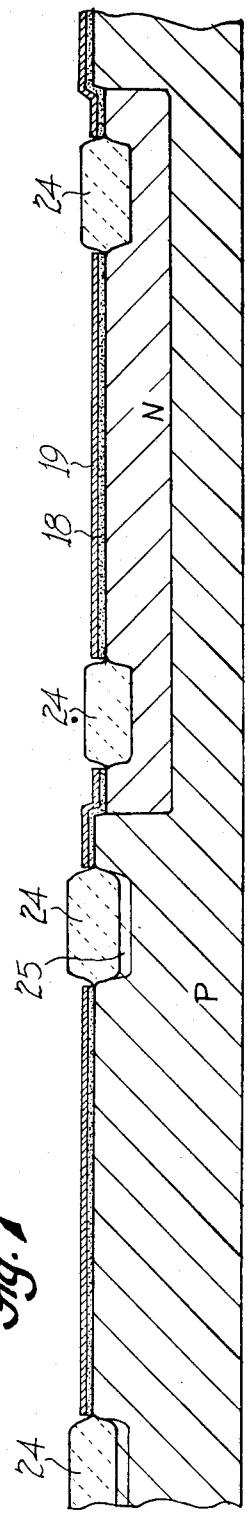

As will be seen in FIG. 8, after removing photoresist a thermal oxidation step at 900° C. in steam for several hours produces a field oxide coating 24 in all areas not masked by the nitride. The oxide thickness is about 9000Å. Channel stop regions 25 are formed beneath the field oxide 24 by diffusion from the implanted P+ regions 23. Part of the implanted boron is consumed with the silicon upon oxidation, but part diffuses ahead of the oxidation front. No channel stop regions are needed beneath the field oxide in the N-type tank regions 15 because of the higher concentration of N-type impurities.

Figure 9:
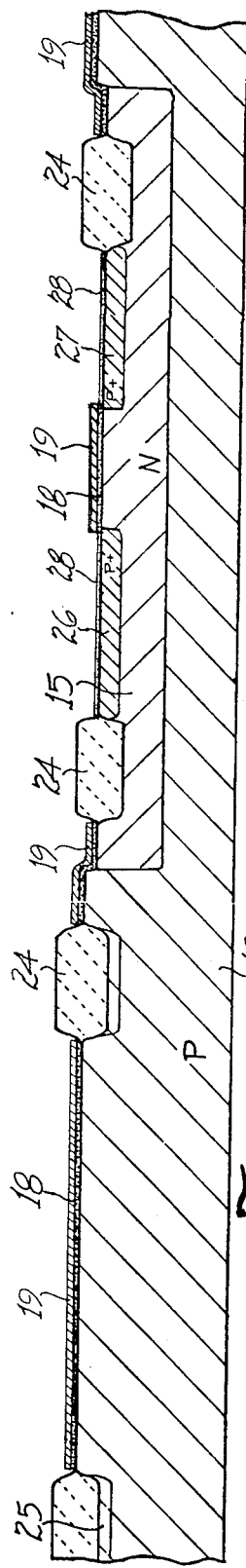

Referring to FIG. 9, the P+ source and drain regions 26 and 27 are next formed by selectively removing the remaining nitride layer 19 and oxide layer 18 above certain parts of the N-type tank 15, using photoresist masking, then depositing boron from BBr$_3$ at 1000° C. After the subsequent heat treatments the resultant diffused P+ regions 26 and 27 have a junction depth of about 2 microns. An oxidation step produces a coating 28 of thermal oxide of about 800Å over the P+ regions 26 and 27 to reduce capacitive coupling between the P+ regions and polysilicon in the finished device. All of the nitride layer 19 is then removed by an etchant.

Figure 10:
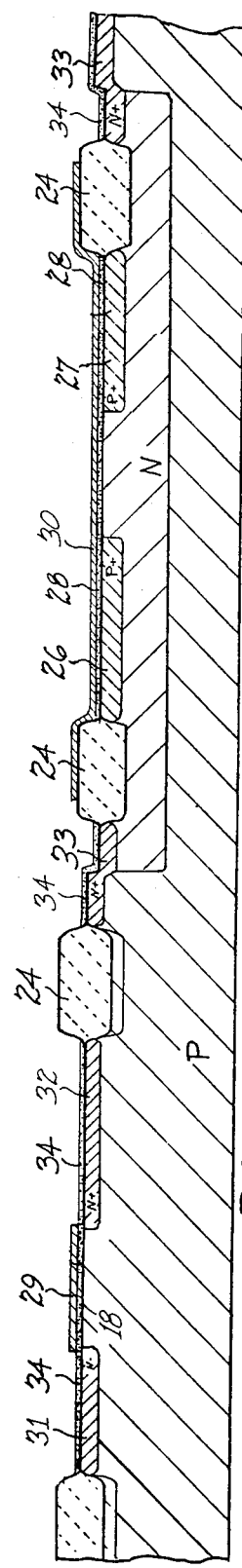

FIG. 10 illustrates the next steps in the process. Another layer of silicon nitride is deposited then patterned to leave an area 29 of nitride over what is to be the N-channel transistor and a coating 30 of nitride over the N-type tank 15. A phosphorus deposition from POCl$_3$ and diffusion at 950° C. is used to produce N+ source and drain regions 31 and 32 and N+ guard ring regions 33 surrounding the N-type tanks 15, with final resulting junction depth about 1.2 micron. Then an oxidation step produces a barrier oxide layer 34 over the N+ regions to a thickness of about 2000Å. The nitride layer 29 and 30 is then removed by etching.

Figure 11:
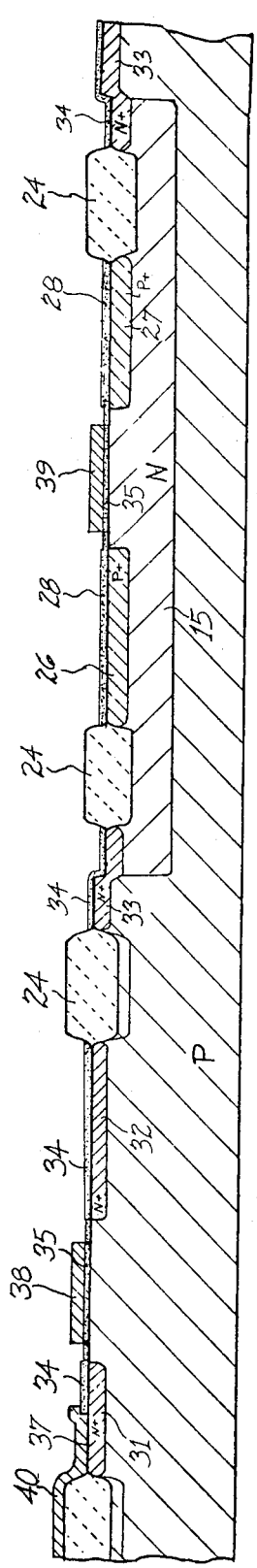

Turning now to FIG. 11, the next step in the process includes removing the remaining nitride coating 29 and 30, and then an etch step is used in the moat areas to remove the thin oxide for the gates of the N-channel and P-channel transistors Q1 and Q2. Oxide is removed without excess etch so that most of the oxide 28 and 34 will remain in place over the source and drain areas. Next, the gate oxide layer 35 is grown over all exposed silicon surfaces by thermal oxidation to a thickness of 600Å. This thickness is selected so that the threshold voltages for the N-channel and P-channel transistors will be +0.8 and −0.8, respectively, taking into account other process parameters such as surface concentrations, QSS, metal work functions, etc., and assuming a single boron implant for Vt adjust which is done at this point with no masking required.

At locations 37 where polysilicon-to-silicon contact is to be made, the oxide 28 or 34 is removed using a photoresist operation. The next step in the process is deposition of a polycrystalline silicon layer over the entire top surface of the slice to form the gates of the transistors and certain interconnections. A phosphorus deposition at this time functions to dope the polysilicon and render it high conductive (N-type). The poly is doped N-type even over the P-channel transistors Q2, in contrast to prior methods; this simplifies the process. A coat of photoresist is then deposited over the polysilicon, and exposed to light through a mask which defines the gates 38 and 39 and interconnection 40, then developed. Etching removes the uncovered polysilicon. It is noted that the gates 38 and 39 are spaced from the source-drain regions 26, 27 or 31, 32 at this point.

Figure 12:
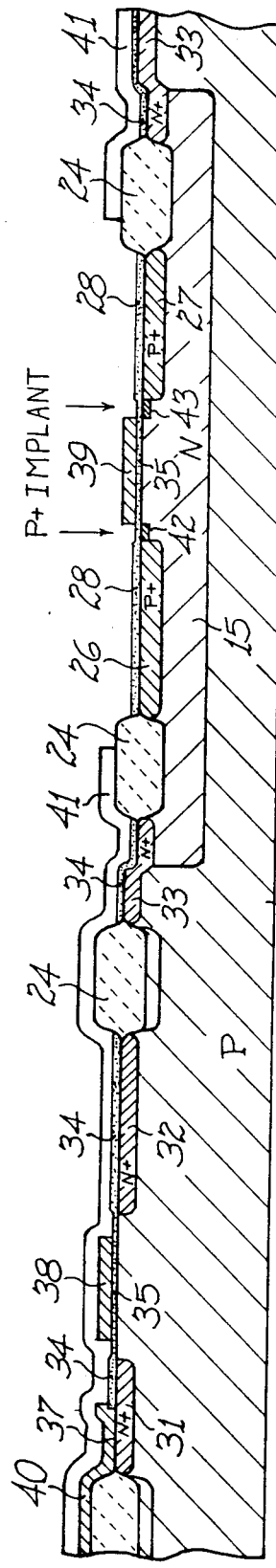

FIG. 12 shows the device after a photoresist layer 41 is applied and patterned to masked the P+ implant. This photoresist mask operation leaves photoresist everywhere except over the P-channel transistor areas. A boron implant of $3.5 \times 10^{13}$ dosage produces P-type regions 42 and 43 for the P-channel transistor in the N-type tank region 15. As will be explained, this implant also provides the "exposed gate oxide" implant for the N-channel transistors Q3 when the process is used to make arrays of memory cell, for example.

Figure 13:
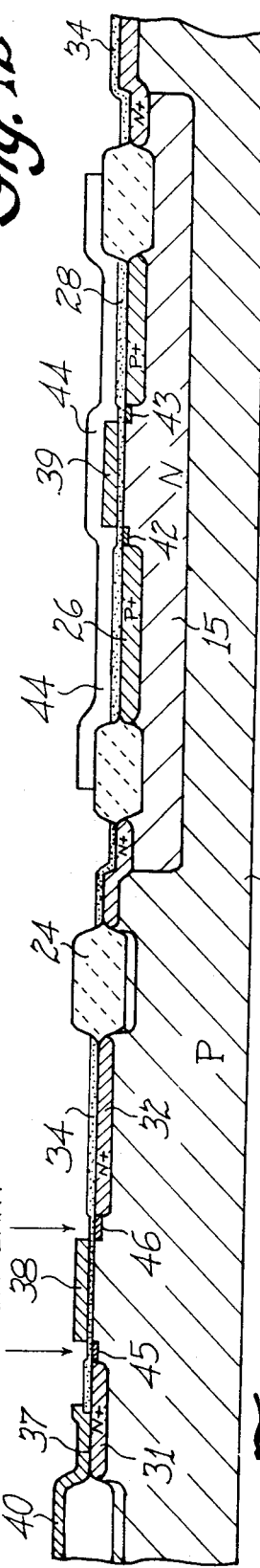

Turning now to FIG. 13 the photoresist coating 41 is removed and another photoresist coating 44 applied and patterned to cover the P-channel transistors Q2. The mask used for this purpose may be the complement of that used for the coating 41. A phosphorus or arsenic implant of $3.5 \times 10^{13}$ dosage produces the N-type regions 45 and 46 which self-align with the gate 38 and bridge the gap between the source and drain regions 31 and 32 and the gate. Again, this implant provides the "exposed gate oxide" implant for the P-channel transistors, as will be explained.

The implants are activated by subjecting the slices to a temperature of about 950° C. in steam for about 10 minutes at this point. The thickness of the oxide over the implanted regions 42,43 and 45,46 is increased from 600Å to 1000Å during this operation, serving to prevent phosphorus from outdiffusing from the multilevel oxide into the silicon during the next step.

Turning now to FIG. 14, the next step is deposition of an interlevel oxide layer 47 to a thickness of about 600Å. The layer 47 is then densified by heating at 1000° C. in a non-oxidizing atmosphere. The oxide layer 47 is patterned by a photoresist operation to open holes at contact areas 48,49 and 50 where metal-to-silicon contacts are to be made. A thin film of polysilicon is deposited using plasma deposition. An aluminum film is deposited over the entire top surface of the slice then patterned to leave only the metal interconnections such as the strips 51 and 52. A protective overcoat (not shown) is added and patterned to expose bonding pads, then the slice scribed and broken into individual bars which are mounted in packages.

An important feature of the process described above is that the source and drain regions 26,27 and 31,32 are defined prior to the time the polysilicon gates 38,39 and interconnects 40, etc., are deposited and defined. Therefore, the source/drain regions (and elongated interconnects thereto in the silicon) or other moat areas may run under polysilicon strips without forming transistors. An example of this is at area 53 of FIG. 15. The designer is thus afforded three independent levels of interconnect: source/drain, polysilicon, and aluminum. Another feature is that the polysilicon is singly-doped instead of doubly-doped, eliminating the need to interconnect P-type poly and N-type poly by aluminum in order to avoid a diode. Prior silicon gate processes, with no source/drain interconnect capability, had essentially 1.5 levels of interconnect; aluminum plus doubly-doped polysilicon. The poly level counted as one-half since it was not fully independent of the moat. A metal gate CMOS process had two full levels of interconnect: source/drain and aluminum. The advantage of three levels is higher component density.

One of the problems is defining the source/drain regions prior to poly is alignment. The gate must have some finite source/drain overlap; this would require a design overlap of two microns so misalignment of masks (within production tolerances) cannot result in a no overlap situation. This two micron overlap, however, adversely affects speed because of the gate to source/drain capacitance. For this reason, the standard self-aligned gate process has been favored; the poly gate is defined first, then used as a diffusion or implant mask in defining the source and drain regions. The standard self-aligned gate process precludes source/drain from running under poly, however, because whenever moat and poly lines cross a transistor is formed.

In the process described herein, the foregoing difficulties are circumvented by the self-aligning implants of FIGS. 12 and 13. When the poly gates 38,39 are defined, see FIG. 11, the edges of the gates are spaced from the interior edges of the source/drain regions 26,27 and 31,32 by an amount at least equal to the alignment tolerance. The P+ and N+ implants then self-align the gates with the source/drain regions by creating the regions 42,43 and 45,46.

In prior self-aligned CMOS processes, the polysilicon over N-channal devices is doped N-type by the source/drain diffusion, while the polysilicon over the P-channel devices is doped P-type by the P+ source/drain diffusion. Direct connection of these doubly-doped polysilicon segments will result in a diode, so P-type poly was connected to N-type poly via aluminum, a compromise of density. In the process of this invention, however, the poly is doped uniformly N-type immediately after deposition and before patterning (FIG. 11) resulting in singly-doped poly. The subsequent self-aligning implants are sufficiently light that they do not affect the conductivity of the poly.

Important features of this process are: aluminum can make contacts to the source/drain regions; polysilicon can make contacts to the source/drain regions; aluminum can run over poly lines; self-aligned transistors are fabricated; aluminum can make contacts to polysilicon; and source/drain regions can run under poly lines. At the same time, circuit density is high and the process is relatively simple and alignments non-critical.

A further important advantage of the process of this invention is the ability to take advantage of the "exposed gate oxide" implant technique of my U.S. Pat. No. 4,061,506 granted. Dec. 6, 1977 assigned to Texas Instruments. In a device such as a ROM or gate array as seen in FIGS. 16a–16c, source and drain lines 31,32 in an N-channel transistor Q3 run parallel to one another and perpendicular to a poly line 38; the channel length is no longer defined by the width of the poly but instead by the spacing between the source/drain lines 31,32. A corresponding P-channel transistor in a tank 15 would have equivalent structure. The gate moat is made wide enough to match or slightly exceed the width of the poly line 38, but by design or by misalignment within tolerance gate oxide is exposed in the areas on the sides of the poly line. These exposed gate oxide areas are implanted by an impurity opposite the source/drain type to prevent surface leakage and degradation with time due to the thin oxide. Thus, the P-channel self-aligning implant (FIG. 12) is also used for the N-channel "exposed gate oxide" implant, producing P-type regions 42,43 seen in FIGS. 16a–16c. Likewise, when the N-channel self-align implant (FIG. 13 is made, the P-channel transistors of the type seen in FIGS. 16a–c will at the same time receive an N-type "exposed gate oxide " implant. No additional masking steps are required; the photoresist 41 of FIG. 12 covers all N-channel transistors Q1 of the type seen in FIG. 12, but exposes all those of the Q3 type seen in FIGS. 16a–16c by an opening 54 in the photoresist, and in the same manner the photoresist 44 of FIG. 13 covers all P-channel transistors Q2 of the type in FIG. 13 but exposes all P-channel transistors corresponding to the Q3 type (but P-channel) seen in FIGS. 16a–16c .

While this invention has been described with reference to an illustrative embodiment, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. An integrated circuit device having insulated gate field effect transistors comprising:
   (a) a silicon substrate,
   (b) a tank region formed in a face of said substrate,
   (c) a first surface area of said face spaced from the tank region for inclusion of a first transistor,
   (d) a second surface area of said face within the tank region for inclusion of a second transistor,
   (e) first and second conductive gates overlying thin gate insulator on said first and second surface areas, respectively,
   (f) source and drain regions in said face at the first surface area on opposite sides of the first gate,
   (g) source and drain regions in said face at the second surface area on opposite sides of the second gate,
   (h) and self aligned implanted regions in said first and second surface areas, respectively, adjacent the gates and said source and drain regions.

2. A device according to claim 1 wherein the first and second gates are polycrystalline silicon.

3. A device according to claim 1 wherein the source and drain regions are much deeper than said implanted regions.

4. A device according to claim 1 wherein the implanted regions include both P and N type and extend along the sides of the gates from source to drain.

5. An integrated circuit device having insulated gate field effect transistors comprising:
   (a) a silicon substrate,
   (b) a first region formed in a face of said substrate,
   (c) a first surface area of said face spaced from the first region for inclusion of a first transistor,
   (d) a second surface area of said face within the first region for inclusion of the second transistor,
   (e) first and second gates overlying thin gate insulator on said first and second surface areas,
   (f) source and drain regions in said face at the first surface area on opposite sides of the first gate,
   (g) source and drain regions in said face at the second surface area on opposite sides of the second gate,
   (h) and self-aligned implanted regions of both impurity types in said first and second surface areas, adjacent the gates and extending between said source and drain regions.

6. A device according to claim 5 wherein the first and second gates are polycrystalline silicon.

7. A device according to claim 6 wherein said first region in said face is N-type, said first transistor is N-channel, and said second transistor is P-channel.

8. A device according to claim 5 wherein the source and drain regions are much deeper than said implanted regions.

9. A method for manufacturing a semiconductor device comprising the steps of forming an isolating region including a field oxide film on one major surface of semiconductor substrate of one conductivity type, forming a gate insulator film on said one major surface of said semiconductor substrate at a position surrounded by said isolating region, depositing on said gate insulator film a conductive film to provide a gate electrode, shaping the width edges of said gate electrode, and thereafter introducing impurities of said one conductivity type into said semiconductor substrate between the width edges of said gate electrode and said field oxide film opposed thereto to form a channel stopper region so thata boundary line of said channel stopper region is substantially in coincidence with said width edge of said gate electrode in the plane view.

10. A method for manufacturing a semiconductor device of claim 9, in which said impurities of said one conductivity type are introduced by ion implantation through said gate insulator film entending from under said gate electrode to said field oxide film.

* * * * *